(12) United States Patent
Nishimura et al.

(10) Patent No.: US 10,889,109 B2
(45) Date of Patent: *Jan. 12, 2021

(54) TEMPERATURE SENSING IN A PRINTHEAD USING PIEZOELECTRIC ACTUATORS

(71) Applicants: Hiroshi Nishimura, West Hills, CA (US); Shogo Nobumori, Thousand Oaks, CA (US)

(72) Inventors: Hiroshi Nishimura, West Hills, CA (US); Shogo Nobumori, Thousand Oaks, CA (US)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/670,491

(22) Filed: Oct. 31, 2019

(65) Prior Publication Data

US 2020/0061988 A1 Feb. 27, 2020

Related U.S. Application Data

(63) Continuation of application No. 15/913,775, filed on Mar. 6, 2018, now Pat. No. 10,493,756.

(51) Int. Cl.
*B41J 2/045* (2006.01)
*G01K 7/34* (2006.01)
*H01L 41/04* (2006.01)
*B41J 2/14* (2006.01)

(52) U.S. Cl.
CPC ......... *B41J 2/04563* (2013.01); *B41J 2/0454* (2013.01); *B41J 2/04528* (2013.01); *B41J 2/04555* (2013.01); *B41J 2/04581* (2013.01); *B41J 2/04588* (2013.01); *B41J 2/04596* (2013.01); *B41J 2002/14354* (2013.01); *G01K 7/34* (2013.01); *H01L 41/042* (2013.01)

(58) Field of Classification Search
CPC .. B41J 2/04563; B41J 2/0454; B41J 2/04581; B41J 2/04528; B41J 2/04596; H01L 41/042; G01K 7/34
See application file for complete search history.

(56) References Cited

U.S. PATENT DOCUMENTS 10,493,756 B2 * 12/2019 Nishimura ........... B41J 2/04563

* cited by examiner

*Primary Examiner* — Julian D Huffman
(74) *Attorney, Agent, or Firm* — Duft & Bornsen, PC

(57) ABSTRACT

Devices and method for performing temperature measurements in a printhead. In one embodiment, a printhead includes at least one row of jetting channels configured to jet droplets of a print fluid using piezoelectric actuators. A drive circuit includes an input voltage generator that applies a step voltage to a piezoelectric actuator of a jetting channel, and an output voltage detector that detects an output voltage across the piezoelectric actuator over time in response to the step voltage. The drive circuit also includes a temperature detector that determines a voltage response to the step voltage at the piezoelectric actuator based on the output voltage over time, and determines a temperature measurement for the piezoelectric actuator based on the voltage response of the piezoelectric actuator.

20 Claims, 11 Drawing Sheets

TEMPERATURE SENSING IN A PRINTHEAD USING PIEZOELECTRIC ACTUATORS

RELATED APPLICATIONS

This non-provisional patent application is a continuation of U.S. patent application Ser. No. 15/913,775 filed on Mar. 6, 2018, which is incorporated herein by reference.

TECHNICAL FIELD

The following disclosure relates to the field of image formation, and in particular, to printheads and the use of printheads.

BACKGROUND

Image formation is a procedure whereby a digital image is recreated on a medium by propelling droplets of ink or another type of print fluid onto a medium, such as paper, plastic, a substrate for 3D printing, etc. Image formation is commonly employed in apparatuses, such as printers (e.g., inkjet printer), facsimile machines, copying machines, plotting machines, multifunction peripherals, etc. The core of a typical jetting apparatus or image forming apparatus is one or more liquid-droplet ejection heads (referred to generally herein as "printheads") having nozzles that discharge liquid droplets, a mechanism for moving the printhead and/or the medium in relation to one another, and a controller that controls how liquid is discharged from the individual nozzles of the printhead onto the medium in the form of pixels.

A typical printhead includes a plurality of nozzles aligned in one or more rows along a discharge surface of the printhead. Each nozzle is part of a "jetting channel", which includes the nozzle, a pressure chamber, and an actuator, such as a piezoelectric actuator. A printhead also includes a drive circuit that controls when each individual jetting channel fires based on image data. To jet from a jetting channel, the drive circuit provides a jetting pulse to the actuator, which causes the actuator to deform a wall of the pressure chamber. The deformation of the pressure chamber creates pressure waves within the pressure chamber that eject a droplet of print fluid (e.g., ink) out of the nozzle.

In an attempt to reduce the size of printheads, the jetting channels within the printheads are moved closer together. Also, Drop on Demand (DoD) printing is moving towards higher productivity and quality, which requires small droplet sizes ejected at high jetting frequencies. The print quality delivered by a printhead depends on ejection or jetting characteristics, such as droplet velocity, droplet mass (or volume/diameter), jetting direction, etc. Temperature of a printhead or the print fluid in the printhead may affect the jetting characteristics. It is therefore desirable to detect temperature variations across a printhead to achieve high quality printing. One way to detect temperature in a printhead is to embed a temperature sensor, such as a thermistor or a thermocouple, in a body of the printhead. Although the use of temperature sensors may be effective in some circumstances, the use of temperature sensors adds additional parts to printheads that are subject to failure, and adds additional cost to the printheads.

SUMMARY

Embodiments described herein use readings from the piezoelectric actuators to detect temperature in a printhead. The piezoelectric actuators are used to jet a print fluid from jetting channels of the printhead. When a piezoelectric actuator is idle, a step voltage is applied to the piezoelectric actuator, and the voltage response of the piezoelectric actuator is measured. The voltage response may be mapped to a temperature measurement for the piezoelectric actuator. Therefore, the piezoelectric actuators may be used as temperature sensors within a printhead. One advantage of using the piezoelectric actuators as temperature sensors is that temperature measurements may be taken at different areas or regions of the printhead to determine a temperature distribution across the printhead. Another advantage is that a dedicated temperature sensor does not need to be embedded in the printhead.

One embodiment comprises a drive circuit for a printhead that includes one or more rows of jetting channels configured to jet droplets of a print fluid using piezoelectric actuators. The drive circuit comprises an input voltage generator configured to apply a step voltage to a piezoelectric actuator of a jetting channel, and an output voltage detector configured to detect an output voltage across the piezoelectric actuator over time in response to the step voltage. The drive circuit further comprises a temperature detector configured to determine a voltage response to the step voltage at the piezoelectric actuator based on the output voltage over time, and to determine a temperature measurement for the piezoelectric actuator based on the voltage response of the piezoelectric actuator.

Another embodiment comprises a method of operating a printhead having one or more rows of jetting channels configured to jet droplets of a print fluid using piezoelectric actuators. The method comprises applying a step voltage to a piezoelectric actuator of a jetting channel, detecting an output voltage across the piezoelectric actuator over time in response to the step voltage, determining a voltage response to the step voltage at the piezoelectric actuator based on the output voltage over time, and determining a temperature measurement for the piezoelectric actuator based on the voltage response of the piezoelectric actuator.

Another embodiment comprises a printhead that includes one or more rows of jetting channels configured to jet droplets of a print fluid. Each of the jetting channels comprises a piezoelectric actuator, a pressure chamber, and a nozzle. The printhead also includes a head driver configured to apply a step voltage to the piezoelectric actuator of a jetting channel, to detect an output voltage across the piezoelectric actuator over time in response to the step voltage, to determine a voltage response to the step voltage at the piezoelectric actuator based on the output voltage over time, and to determine a temperature measurement for the piezoelectric actuator based on the voltage response of the piezoelectric actuator.

The above summary provides a basic understanding of some aspects of the specification. This summary is not an extensive overview of the specification. It is intended to neither identify key or critical elements of the specification nor delineate any scope particular embodiments of the specification, or any scope of the claims. Its sole purpose is to present some concepts of the specification in a simplified form as a prelude to the more detailed description that is presented later.

DESCRIPTION OF THE DRAWINGS

Some embodiments of the present disclosure are now described, by way of example only, and with reference to the accompanying drawings. The same reference number represents the same element or the same type of element on all drawings.

DETAILED DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
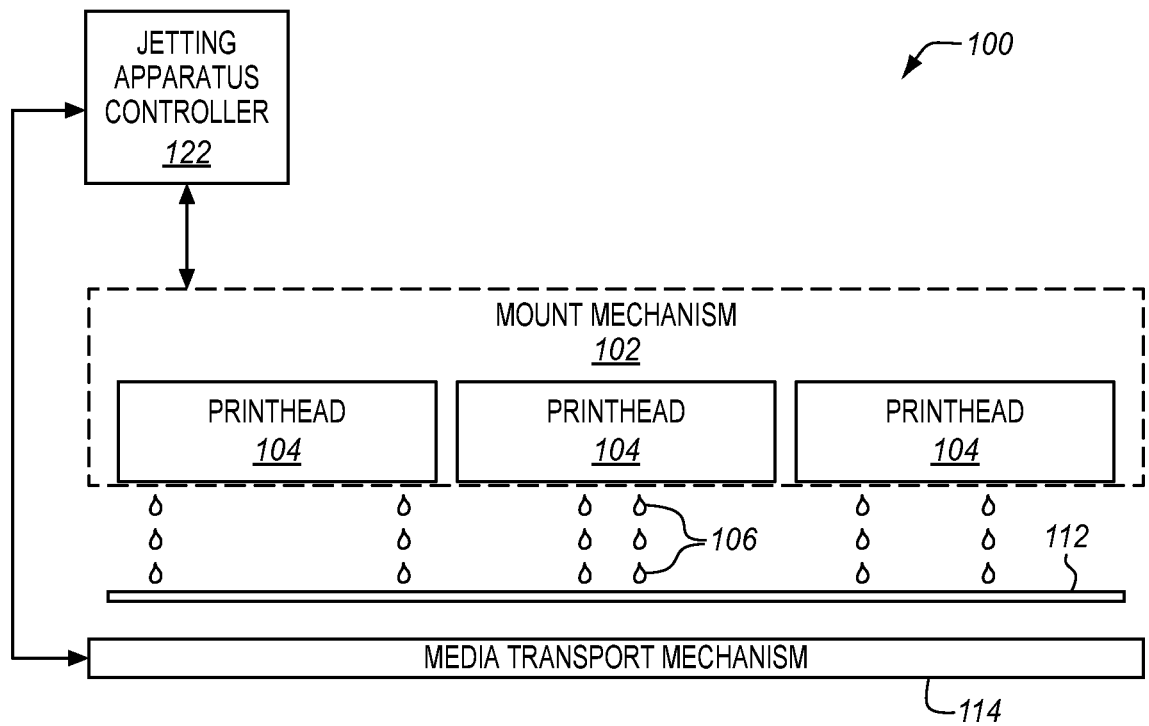
FIG. 1 is a schematic diagram of a jetting apparatus in an illustrative embodiment.

FIG. 1 is a schematic diagram of a jetting apparatus 100 in an illustrative embodiment. One example of jetting apparatus 100 is an inkjet printer that performs single-pass or multi-pass printing. Jetting apparatus 100 includes a mount mechanism 102 that supports one or more printheads 104 above a medium 112. Mount mechanism 102 may comprise a carriage assembly that reciprocates back and forth along a scan line or scan directions for multi-pass printing. Alternatively, mount mechanism 102 may be fixed within jetting apparatus 100 for single-pass printing. Printheads 104 are a device, apparatus, or component configured to eject droplets 106 of a print fluid, such as ink (e.g., water, solvent, oil, or UV-curable), through a plurality of orifices or nozzles (not visible in FIG. 1). The droplets 106 ejected from the nozzles of printheads 104 are directed toward medium 112. Medium 112 comprises any type of material upon which ink or another print fluid is applied by a printhead, such as paper, plastic, card stock, transparent sheets, a substrate for 3D printing, cloth, etc. Typically, nozzles of printheads 104 are arranged in one or more rows so that ejection of print fluid from the nozzles causes formation of characters, symbols, images, layers of an object, etc., on medium 112 as printhead 104 and/or medium 112 are moved relative to one another. Media transport mechanism 114 is configured to move medium 112 relative to printheads 104. Jetting apparatus 100 also includes a jetting apparatus controller 122 that controls the overall operation of jetting apparatus 100. Jetting apparatus controller 122 may connect to a data source to receive image data, and control each printhead 104 to discharge the print fluid on a desired pixel grid on medium 112.

Figure 2:
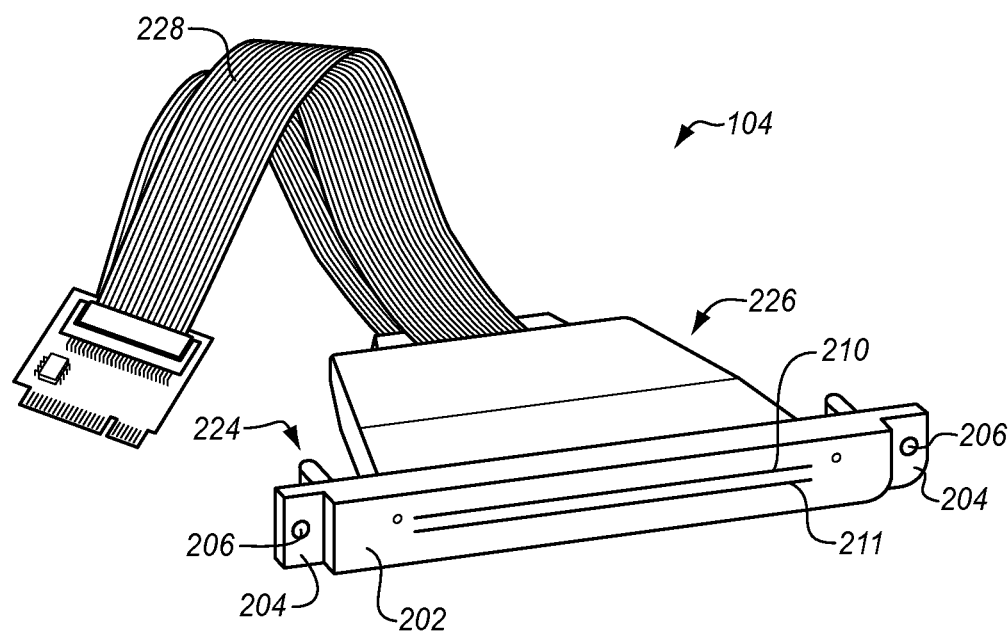
FIG. 2 is a perspective view of a printhead in an illustrative embodiment.

FIG. 2 is a perspective view of printhead 104 in an illustrative embodiment. Printhead 104 includes a nozzle plate 202, which represents the discharge surface of printhead 104. Nozzle plate 202 includes a plurality of nozzles that jet or eject droplets of print fluid, and the nozzles are arranged in rows 210-211. Although two rows 210-211 of nozzles are illustrated in FIG. 2, printhead 104 may include a single row of nozzles, three rows of nozzles, four rows of nozzles, etc. Printhead 104 also includes attachment members 204. Attachment members 204 are configured to secure printhead 104 to a jetting apparatus, such as to mount mechanism 102 as illustrated in FIG. 1. Attachment members 204 may include one or more holes 206 so that printhead 104 may be mounted within a jetting apparatus by screws, bolts, pins, etc. Opposite nozzle plate 202 is the side of printhead 104 used for input/output (I/O) of print fluid, electronic signals, etc. This side of printhead 100 is referred to as the I/O side 224. I/O side 224 includes electronics 226 that connect to a controller board through cabling 228, such as a ribbon cable. Electronics 226 control how the nozzles of printhead 104 jet droplets in response to control signals provided by the controller board.

Figure 3A:
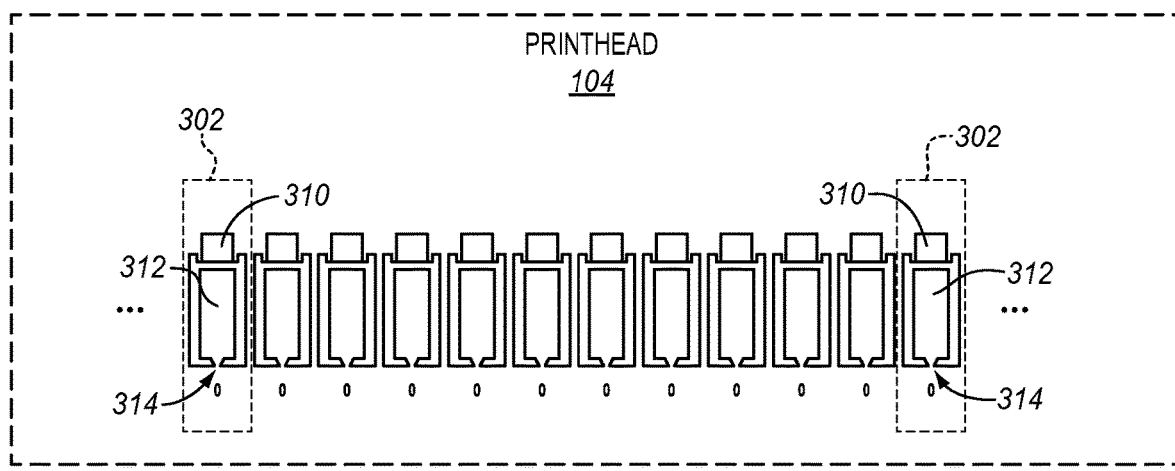
FIGS. 3A and 3B are schematic diagrams of a jetting channel within a printhead in an illustrative embodiment.
Figure 3B:
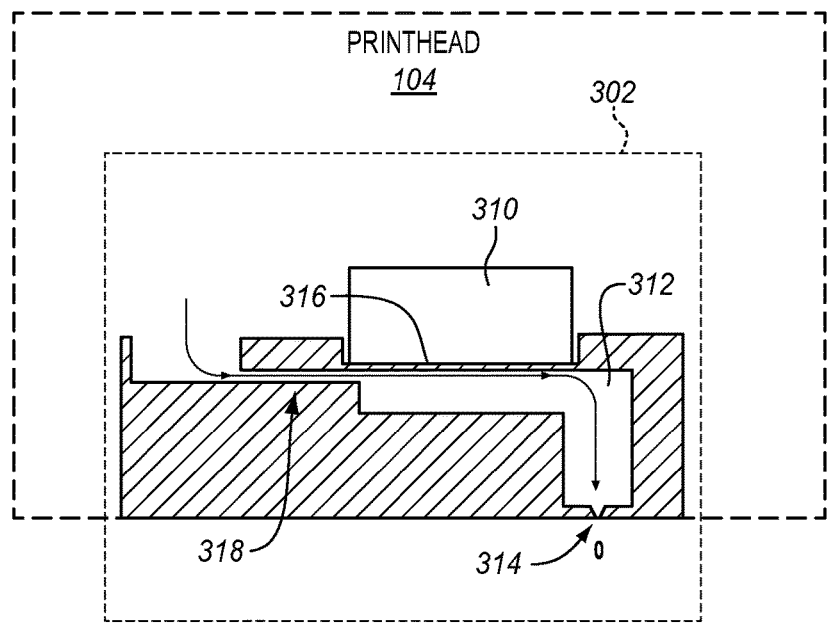

FIG. 3A is a schematic diagram of a row of jetting channels 302 within printhead 104 in an illustrative embodiment. Printhead 104 includes multiple jetting channels 302 that are arranged in a line or row (e.g., row 210 in FIG. 2) along a length of printhead 104, and each jetting channel 302 in a row may have a similar configuration as shown in FIG. 3A. Each jetting channel 302 includes a piezoelectric actuator 310, a pressure chamber 312, and a nozzle 314. FIG. 3B is a schematic diagram of a jetting channel 302 within printhead 104 in an illustrative embodiment. The view in FIG. 3B is of a cross-section of jetting channel 302 across a width of printhead 104. The arrow in FIG. 3B illustrates a flow path of a print fluid within jetting channel 302. The print fluid flows from a supply manifold in printhead 104 and into pressure chamber 312 through restrictor 318. Restrictor 318 fluidly connects pressure chamber 312 to a fluid supply, such as a supply manifold, and controls the flow of the print fluid into pressure chamber 312. One wall of pressure chamber 312 is formed with a diaphragm 316 that physically interfaces with piezoelectric actuator 310. Diaphragm 316 may comprise a sheet of semi-flexible material that vibrates in response to actuation by piezoelectric actuator 310. The print fluid flows through pressure chamber 312 and out of nozzle 314 in the form of a droplet in response to actuation by piezoelectric actuator 310. Piezoelectric actuator 310 is configured to receive a drive waveform, and to actuate or "fire" in response to a jetting pulse on the drive waveform. Firing of piezoelectric actuator 310 in jetting channel 302 creates pressure waves in pressure chamber 312 that cause jetting of a droplet from nozzle 314.

Jetting channel 302 as shown in FIGS. 3A-3B is an example to illustrate a basic structure of a jetting channel, such as the actuator, pressure chamber, and nozzle. Other types of jetting channels are also considered herein. For example, some jetting channels may be a "flow-through" type having another restrictor that fluidly connects pressure chamber 312 to a return manifold (not shown) in printhead 104. Some jetting channels may have a pressure chamber having a different shape than is illustrated in FIGS. 3A and 3B.

Figure 4:
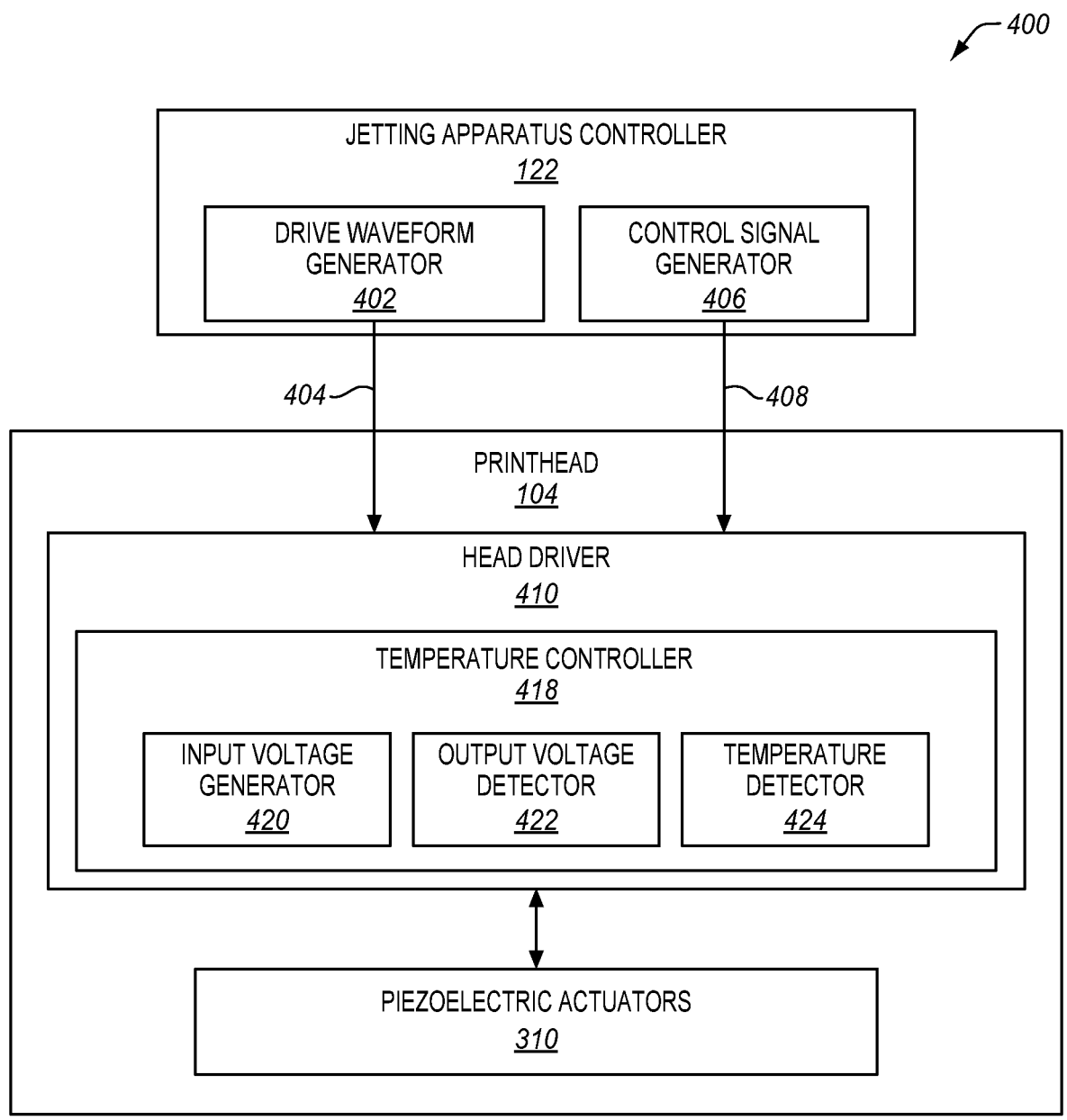
FIG. 4 is a block diagram illustrating a drive circuit for a printhead in an illustrative embodiment.

FIG. 4 is a block diagram illustrating a drive circuit 400 for printhead 104 in an illustrative embodiment. Drive circuit 400 is an apparatus or assembly of circuits/devices that controls printhead 104 to eject a print fluid on a medium to form pixels on the medium. Drive circuit 400 includes a drive waveform generator 402 configured to generate a drive waveform 404 (e.g., a trapezoidal waveform), and provide the drive waveform 404 to printhead 104 as a drive signal for piezoelectric actuators 310. Although not illustrated, drive waveform generator 402 may also include an amplifier circuit that amplifies the current of drive waveform 404. Drive circuit 400 also includes a control signal generator 406 configured to provide one or more control signals 408 to printhead 104 for selectively applying drive waveform 404 to individual jetting channels 302. Control signal generator 406 may receive image data, such as serial data, that specifies non-jetting or jetting by individual jetting channels 302 for pixels. One example of image data is a bitmap that defines pixel locations and values for each pixel location. In one embodiment, the image data may include two-bit values that define different grey-scale levels for individual pixels. In this example, a value of "00" may define non-jetting for a pixel by a jetting channel 302. A value of "01", "10", and "11" may define jetting of one, two, or three droplets for a pixel by a jetting channel 302, respectively. Control signal generator 406 may process the image data, and generate control signals 408 that include data signals, latch signals, a serial clock, gating signals, etc.

Drive circuit 400 also includes a head driver 410 coupled to piezoelectric actuators 310. Head driver 410 may be an example of electronics 226 of printhead 104 as shown in FIG. 2. Head driver 410 is configured to selectively control which jetting channels 302 receive the drive waveform 404, and time windows when the jetting channels 302 receive the drive waveform 404. Head driver 410 may comprise an integrated circuit that is fabricated on printhead 104. Drive waveform generator 402 and control signal generator 406 are illustrated as part of jetting apparatus controller 122, which may couple to printhead 104 via a signal transmission cable, such as a flexible flat cable (FFC). In another embodiment, drive waveform generator 402 may also be part of an integrated circuit within printhead 104.

Piezoelectric actuators 310 are the actuating devices for jetting channels 302 that act to jet a droplet out of a nozzle 314 in response to a jetting pulse. A piezoelectric actuator 310, for example, converts electrical energy directly into linear motion. To jet from a jetting channel 302, one or more jetting pulses of the drive waveform 404 are provided to a piezoelectric actuator 310. A jetting pulse causes a deformation, physical displacement, or stroke of a piezoelectric actuator 310, which in turn acts to deform a wall of pressure chamber 312 (e.g., diaphragm 316). Deformation of the chamber wall generates pressure waves inside pressure chamber 312 that force a droplet from jetting channel 302 (when specific conditions are met). A standard jetting pulse is therefore able to cause a droplet to be jetted from a jetting channel 302 with the desired properties when the jetting channel 302 is at rest.

Figure 5:
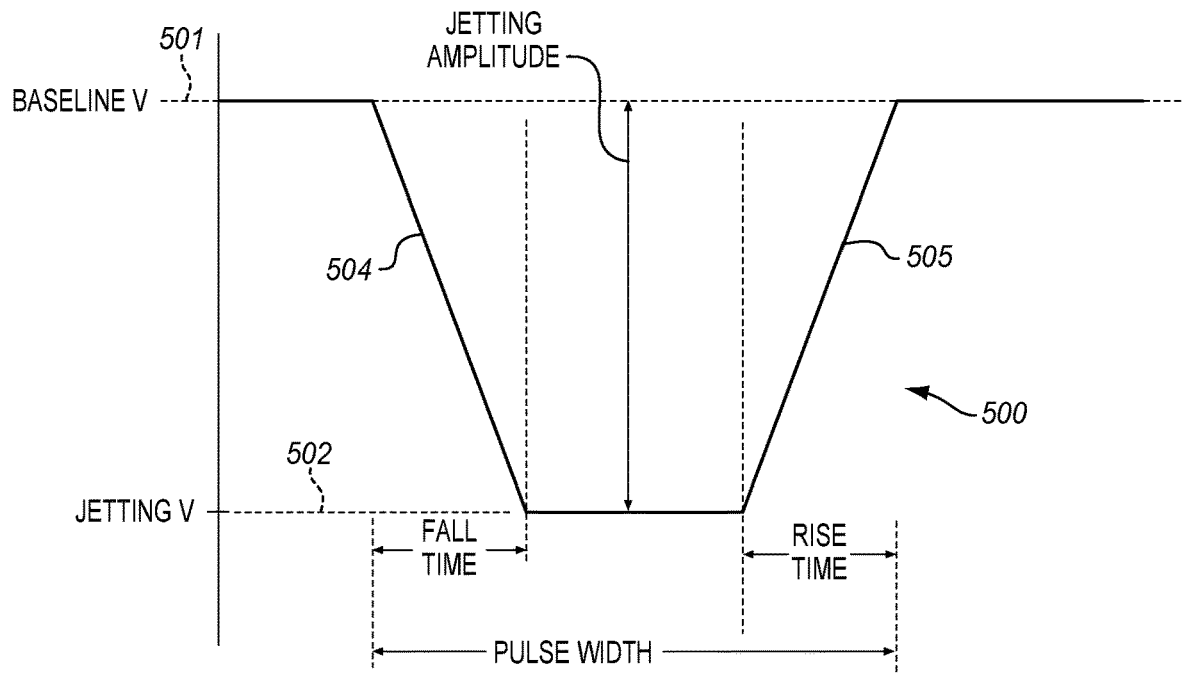
FIG. 5 illustrates a jetting pulse of a drive waveform for a printhead.

FIG. 5 illustrates a jetting pulse 500 of a drive waveform for a printhead. The drive waveform in FIG. 5 is shown as an active-low signal, but may be an active-high signal in other embodiments. Jetting pulse 500 has a trapezoidal shape, and may be characterized by the following parameters: fall time, rise time, pulse width, and jetting amplitude. Jetting pulse 500 transitions from a baseline (high) voltage 501 to a jetting (low) voltage 502 along a leading edge 504. The potential difference between the baseline voltage 501 and the jetting voltage 502 represents the amplitude of jetting pulse 500, which is a peak amplitude of jetting pulse 500. Jetting pulse 500 then transitions from jetting (low) voltage 502 to baseline (high) voltage 501 along a trailing edge 505. These parameters of jetting pulse 500 can impact the jetting characteristics of the droplets from the printhead (e.g., droplet velocity and mass). For example, when the amplitude of jetting pulse 500 equals a target jetting amplitude (i.e., the jetting voltage) for a target pulse width, a droplet of a desired velocity and mass is jetted from a jetting channel 302. A standard jetting pulse 500 may be selected for different types of printheads to produce droplets having a desired shape (e.g., spherical), size, velocity, etc.

The following provides an example of jetting a droplet from a jetting channel using jetting pulse 500, such as from jetting channel 302 in FIGS. 3A-3B. Jetting pulse 500 is initially at the baseline voltage 501, and transitions from the baseline voltage 501 to the jetting voltage 502. The leading edge 504 (i.e., the first slope) of jetting pulse 500 causes a piezoelectric actuator 310 to displace in a first direction, which enlarges pressure chamber 312 and generates negative pressure waves within pressure chamber 312. The negative pressure waves propagate within pressure chamber 312 and are reflected by structural changes in pressure chamber 312 as positive pressure waves. The trailing edge 505 (i.e., the second slope) of jetting pulse 500 causes the piezoelectric actuator 310 to displace in an opposite direction, which reduces pressure chamber 312 to its original size and generates another positive pressure wave. When the timing of the trailing edge 505 of jetting pulse 500 is appropriate, the positive pressure waves created by the piezoelectric actuator 310 displacing to reduce the size of pressure chamber 312 will combine with the reflected positive pressure waves to form a combined wave that is large enough to cause a droplet to be jetted from nozzle 314 of jetting channel 302. Therefore, the positive pressure waves generated by the trailing edge 505 of jetting pulse 500 acts to amplify the positive pressure waves that reflect within pressure chamber 312 due to the leading edge 504 of jetting pulse 500. The geometry of pressure chamber 312 and jetting pulse 500 are designed to generate a large positive pressure peak at nozzle 314, which drives the print fluid through nozzle 314.

Figure 6:
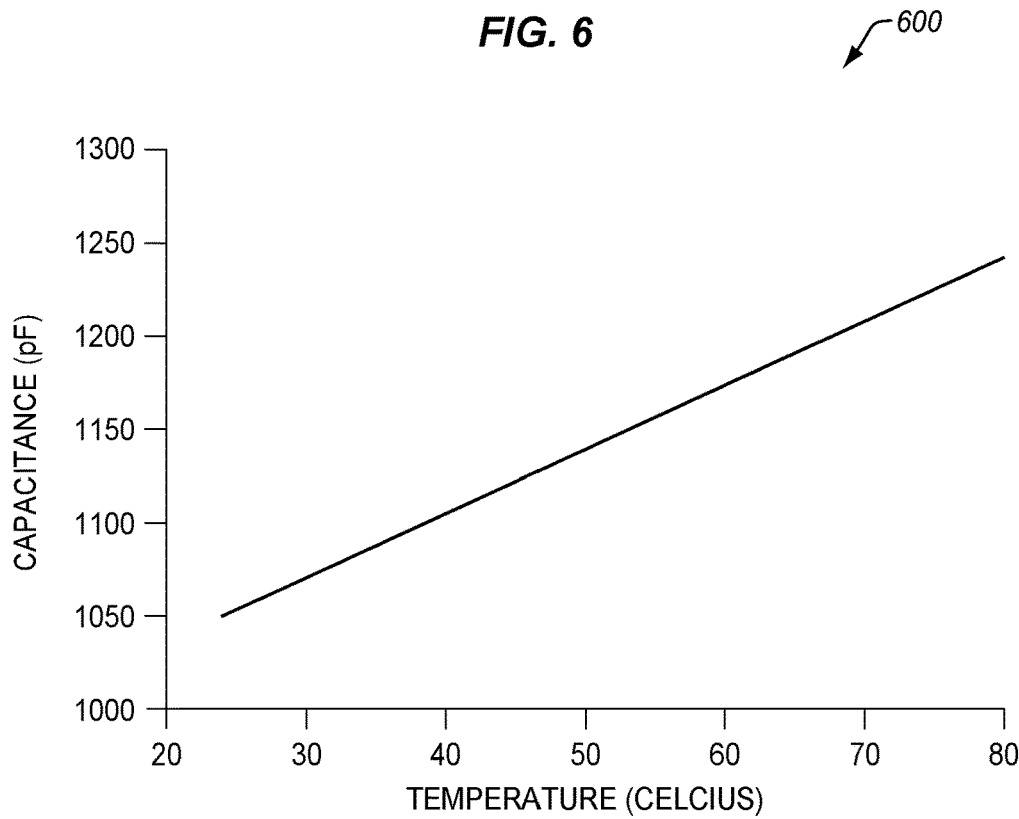
FIG. 6 is a capacitance-temperature graph for a piezoelectric actuator in an illustrative embodiment.

In the embodiments described herein, drive circuit 400 is enhanced to perform temperature measurements in printhead 104 using the piezoelectric actuators. A piezoelectric actuator 310 behaves like a capacitor. The capacitance of a piezoelectric actuator 310 may depend on the area and thickness of the crystal or ceramic, and material properties of the crystal or ceramic used in the piezoelectric actuator 310. The capacitance of a piezoelectric actuator 310 may also depend on the temperature of or around the piezoelectric actuator 310. FIG. 6 is a capacitance-temperature graph 600 for a piezoelectric actuator 310 in an illustrative embodiment. The vertical axis is the capacitance of a piezoelectric actuator 310 in picofarad (pF). The horizontal axis is the temperature of a piezoelectric actuator 310 in degrees Celsius. As is evident from graph 600, the capacitance of a piezoelectric actuator 310 has a linear or substantially linear relationship with temperature. When the temperature of a piezoelectric actuator 310 is low (e.g., less than 35° C.), the capacitance of the piezoelectric actuator 310 is low (e.g., less than 1080 pF). When the temperature of a piezoelectric actuator 310 is high (e.g., more than 60° C.), the capacitance of the piezoelectric actuator 310 is high (e.g., more than 1150 pF). Thus, the capacitance of a piezoelectric actuator 310 may be used as an indicator of temperature at the piezoelectric actuator 310. The temperature of the piezoelectric actuator 310 is indicative of the temperature in printhead 104 at the location of the piezoelectric actuator 310 within the printhead 104. Thus, temperature detection of piezoelectric actuators 310 can be used to determine a temperature distribution across printhead 104.

In FIG. 4, head driver 410 includes a temperature controller 418, which comprises circuits, logic, processors, etc., configured to perform temperature measurements at piezoelectric actuators 310 within printhead 104. Temperature controller 418 includes an input voltage generator 420, an output voltage detector 422, and a temperature detector 424. Input voltage generator 420 is configured to generate a step voltage that is applied to a piezoelectric actuator 310. Output voltage detector 422 is configured to detect an output voltage across the piezoelectric actuator 310 over time in response to the step voltage. Temperature detector 424 is configured to determine a voltage response of the piezoelectric actuator 310 in response to the step voltage, and determine a temperature measurement based on the voltage response of the piezoelectric actuator 310. A further description of the operation of head driver 410 is described below in FIG. 7.

Figure 7:
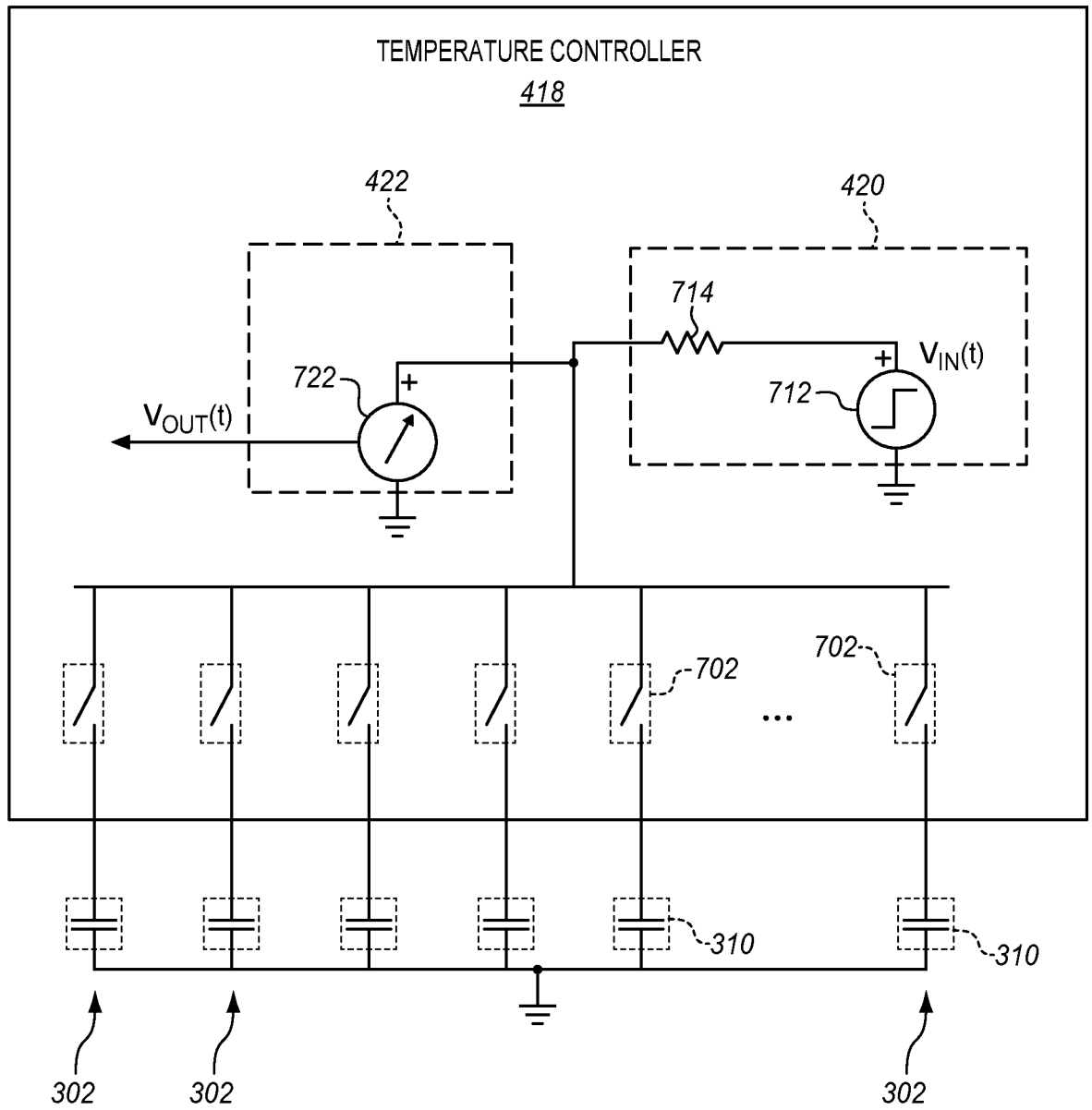
FIG. 7 is a schematic diagram of a temperature controller in an illustrative embodiment.

FIG. 7 is a schematic diagram of temperature controller 418 in an illustrative embodiment. As discussed above, printhead 104 includes a plurality of jetting channels 302, and each jetting channel 302 includes a piezoelectric actuator 310. Because a piezoelectric actuator 310 behaves like a capacitor, piezoelectric actuators 310 are illustrated as capacitors in FIG. 7. Printhead 104, or more particularly, head driver 410 of printhead 104, includes a plurality of switching elements 702, which may also be referred to as transmission gates. A switching element 702 is associated with an individual jetting channel 302, which means that an individual switching element 702 is electrically coupled to a piezoelectric actuator 310 of a jetting channel 302. A switching element 702 is configured to selectively enable or disable a conductive path to a piezoelectric actuator 310.

Input voltage generator 420 includes a step voltage source 712 and a resistor 714, although it may include other components in other embodiments. Step voltage source 712 is configured to generate a step voltage ($V_{IN}$) as is described in further detail below. Output voltage detector 422 includes a voltage measuring instrument 722 that is configured to measure an output voltage across a piezoelectric actuator 310, although it may include other components in other embodiments. If, for example, switching element 702 of the jetting channel 302 furthest to the right in FIG. 7 is closed and the other switching elements 702 of the other jetting channels 302 are open, then voltage measuring instrument 722 is able to measure an output voltage across the piezoelectric actuator 310 furthest to the right in FIG. 7. Voltage measuring instrument 722 is able to output a measurement or indication of the output voltage ($V_{OUT}$) to another device, such as temperature detector 424 in FIG. 4.

Figure 8:
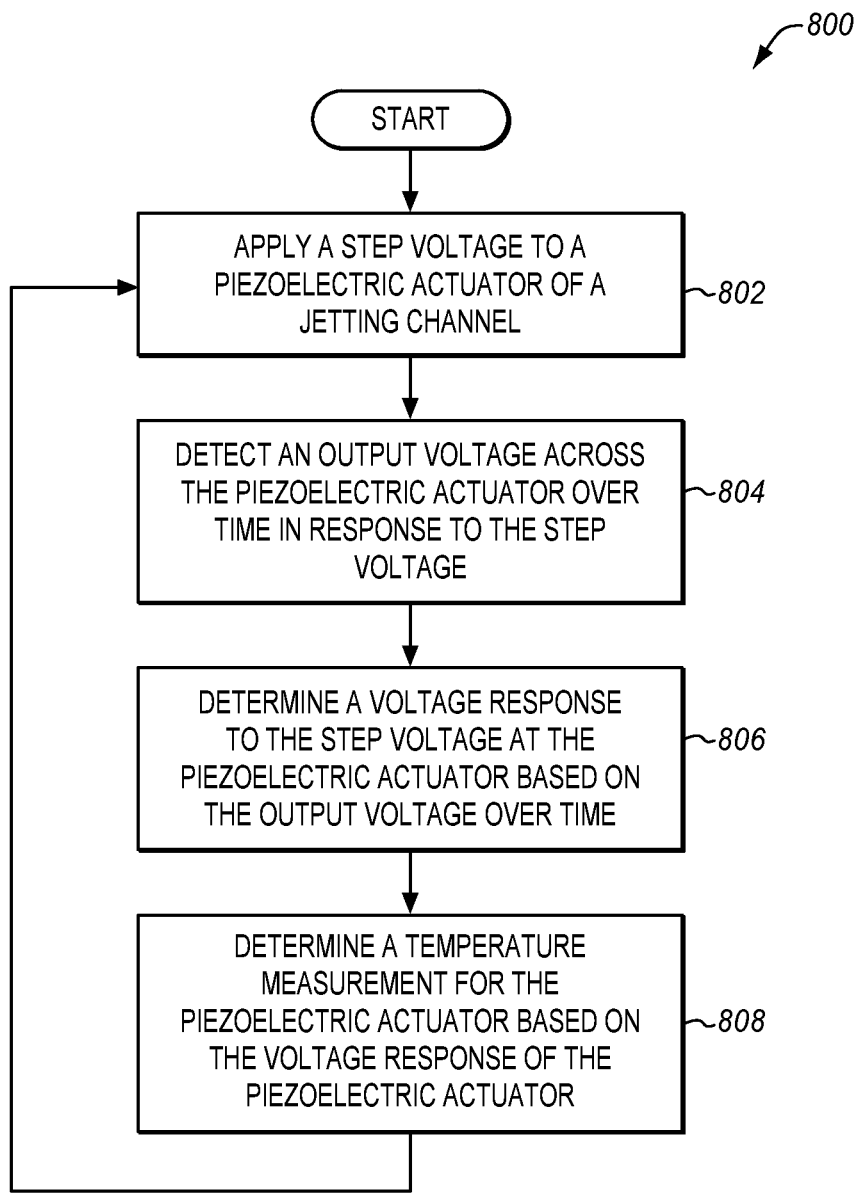
FIG. 8 is a flow chart illustrating a method of performing temperature measurements within a printhead in an illustrative embodiment.

FIG. 8 is a flow chart illustrating a method 800 of performing temperature measurements within a printhead in an illustrative embodiment. The steps of method 800 will be described with respect to head driver 410 in FIG. 4, although one skilled in the art will understand that the methods described herein may be performed by other devices or systems not shown. The steps of the methods described herein are not all inclusive and may include other steps not shown.

Figure 9:
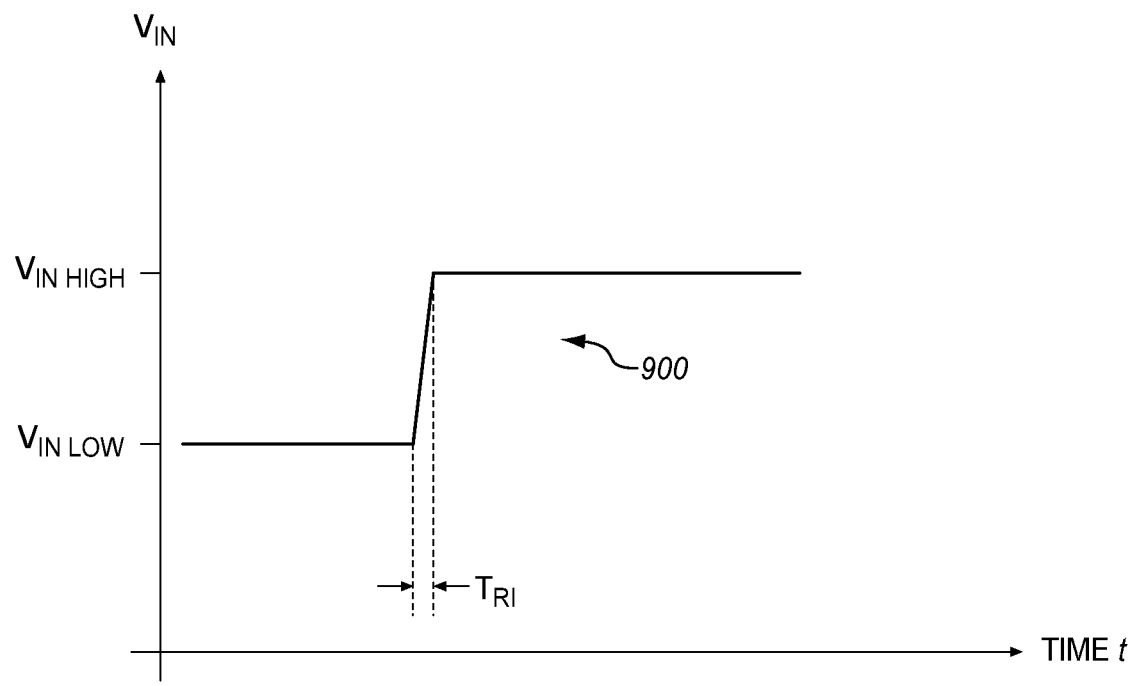
FIG. 9 illustrates a step voltage in an illustrative embodiment.

Input voltage generator 420 applies a step voltage to a piezoelectric actuator 310 of a jetting channel 302 (step 802). For example, switching element 702 of one of the jetting channels 302 may be closed to enable a conductive path between input voltage generator 420 and the piezoelectric actuator 310 of that jetting channel 302. With the conductive path enabled, input voltage generator 420 is able to apply the step voltage to the piezoelectric actuator 310. FIG. 9 illustrates a step voltage 900 in an illustrative embodiment. A step voltage, which may also be referred to as a step input or a step voltage change, comprises a sudden change in voltage level that happens once. In this example, step voltage 900 transitions from a first voltage ($V_{IN\ LOW}$) to a second voltage ($V_{IN\ HIGH}$) over a rise time ($T_{RI}$). A step voltage is distinguished from a periodic signal or a pulse, as the voltage change in a step voltage occurs once. Because step voltage 900 is not a pulse, step voltage 900 will not cause the piezoelectric actuator 310 to jet print fluid from its corresponding nozzle 314 when applied to the piezoelectric actuator 310.

Figure 10:
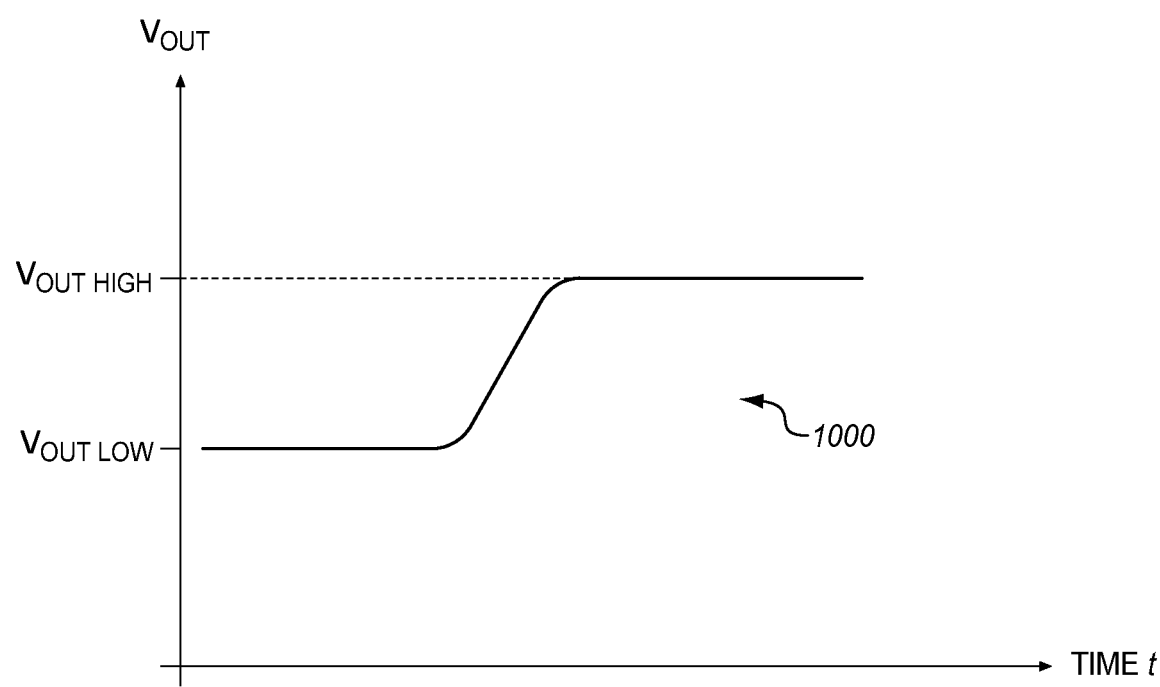
FIG. 10 illustrates a voltage response in an illustrative embodiment.

In FIG. 8, output voltage detector 422 detects an output voltage ($V_{OUT}$) across piezoelectric actuator 310 over time in response to step voltage 900 (step 804). Temperature detector 424 determines a voltage response to the step voltage 900 at the piezoelectric actuator 310 based on the output voltage over time (step 806). FIG. 10 illustrates a voltage response 1000 in an illustrative embodiment. Step voltage 900 is an abrupt change in voltage, and the response of the piezoelectric actuator 310 may be referred to as a step transient response. When the step voltage 900 is applied, current will start flowing around the completed circuit and increase the output voltage across the piezoelectric actuator 310. Current will continue to flow as long as there is a voltage difference between the piezoelectric actuator 310 and step voltage source 712 across resistor 714 (see FIG. 7). Thus, the output voltage across the piezoelectric actuator 310 will increase from a first voltage ($V_{OUT\ LOW}$) to a second voltage ($V_{OUT\ HIGH}$) over a time period until reaching a steady-state voltage.

In FIG. 8, temperature detector 424 determines a temperature measurement for the piezoelectric actuator 310 based on the voltage response 1000 of the piezoelectric actuator 310 (step 808). The temperature measurement may comprise an actual temperature of the piezoelectric actuator 310 (e.g., 60° C.), a temperature range (e.g., between 50° C. and 80° C., above 50° C., below 50° C., etc.), a temperature indicator or state (e.g., "low", "high", etc.), or another type of measurement. Input voltage generator 420 forms an RC circuit when electrically coupled to a piezoelectric actuator 310 (see FIG. 7). Thus, the principles of an RC circuit may be used to analyze the voltage response of a piezoelectric actuator 310, and determine a temperature measurement. For example, the transient voltage response when charging an RC circuit may be characterized as:

$$V_{OUT}(t) = V_{IN}(1 - e^{-\frac{t}{RC}}),$$

where R is the resistance of resistor 714, and C is the capacitance of the piezoelectric actuator 310.

RC is the time constant in this equation. The lower the RC time constant, the faster the voltage response of the piezoelectric actuator 310. The higher the RC time constant, the slower the voltage response of the piezoelectric actuator 310. If the value of R is constant, the RC time constant is dependent on the capacitance of the piezoelectric actuator 310. Thus, the lower the capacitance of the piezoelectric actuator 310, the faster the voltage response of the piezoelectric actuator 310. The higher the capacitance of the piezoelectric actuator 310, the slower the voltage response of the piezoelectric actuator 310. These principles may be used to determine a temperature measurement for the piezoelectric actuator 310 based on its voltage response, as the capacitance of the piezoelectric actuator 310 depends on temperature.

Figure 11:
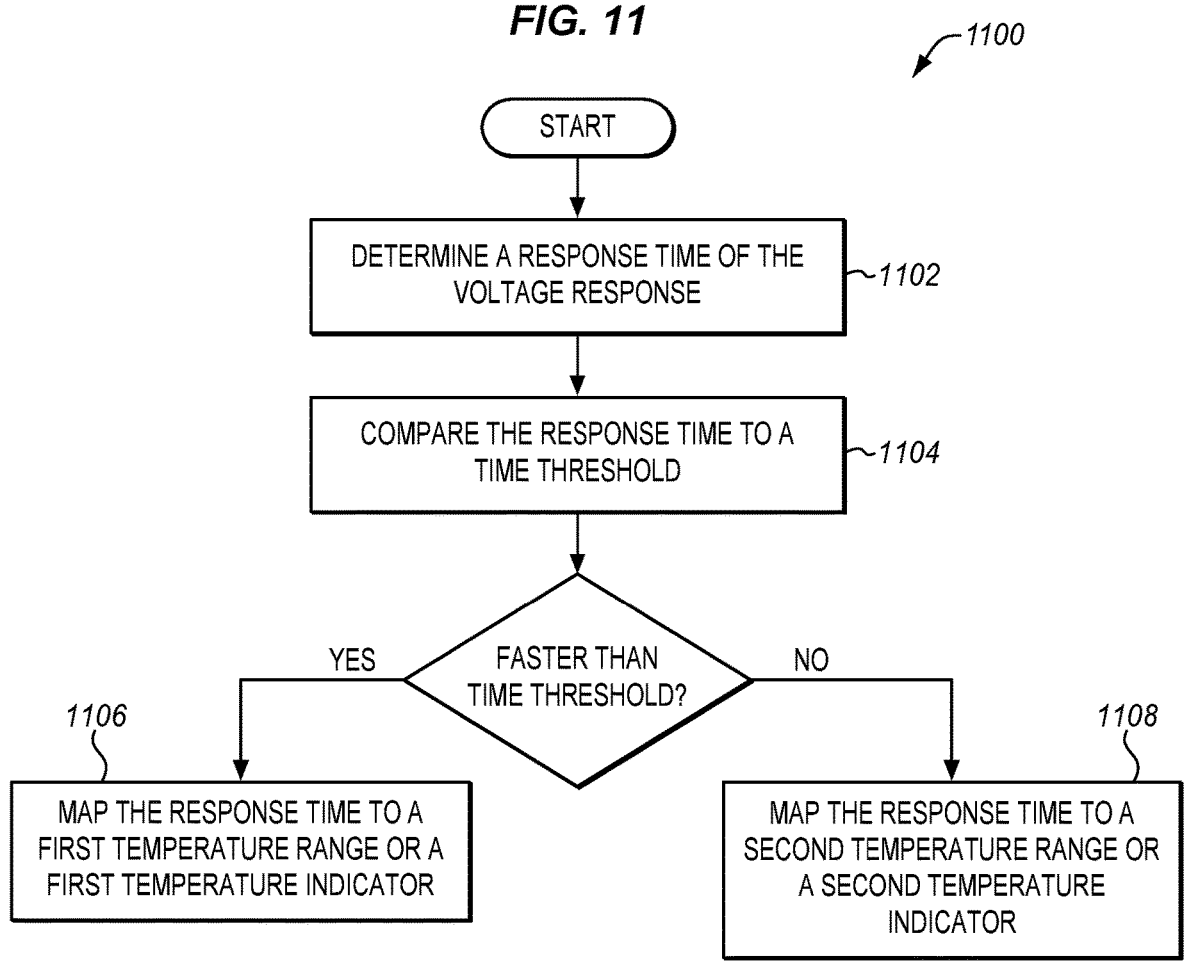
FIG. 11 is a flow chart illustrating a method of determining a temperature range or a temperature indicator for a piezoelectric actuator in an illustrative embodiment.
Figure 12:
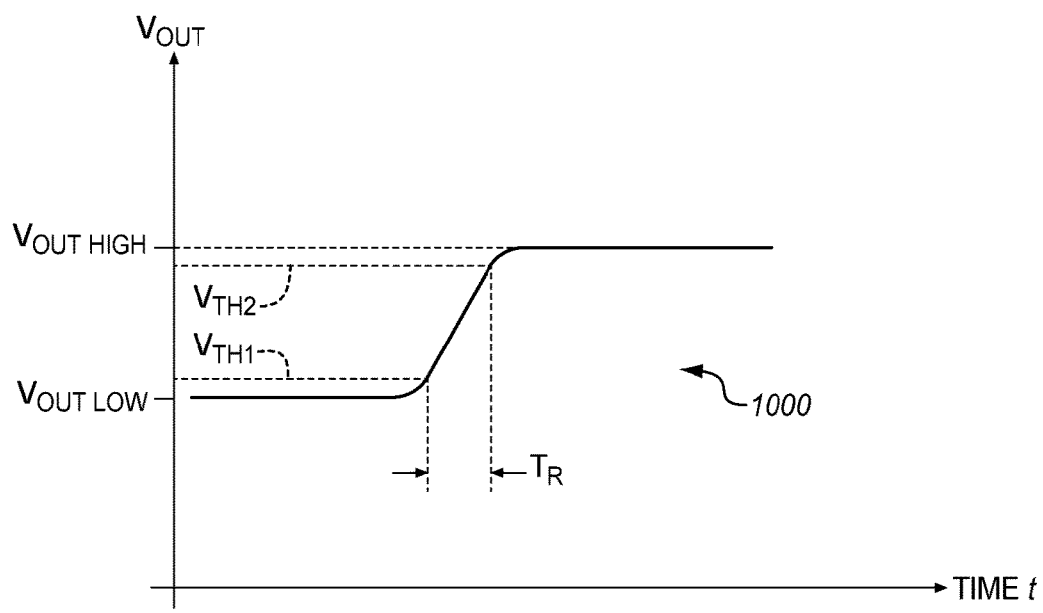
FIG. 12 illustrates the response time of a piezoelectric actuator in an illustrative embodiment.

In one embodiment, the temperature measurement may relate the temperature of a piezoelectric actuator 310 to a temperature range or temperature indicator. In other words, instead of calculating the exact temperature of a piezoelectric actuator 310 based on the voltage response, the temperature measurement represents a range or indicator of the temperature for the piezoelectric actuator 310. FIG. 11 is a flow chart illustrating a method 1100 of determining a temperature range or a temperature indicator for a piezoelectric actuator 310 in an illustrative embodiment. Temperature detector 424 determines a response time of the voltage response 1000 (step 1102). FIG. 12 illustrates the response time of a piezoelectric actuator 310 in an illustrative embodiment. FIG. 12 illustrates the voltage response 1000 as shown in FIG. 10. The response time $T_R$ is measured between a first voltage threshold ($V_{TH1}$) and a second voltage threshold ($V_{TH2}$). The voltage thresholds may be selected as desired. In one embodiment, the first voltage threshold may be 10% of the maximum output voltage ($V_{OUT\,HIGH}$), and the second voltage threshold may be 90% of the maximum output voltage ($V_{OUT\,HIGH}$).

In FIG. 11, temperature detector 424 compares the response time to a time threshold (step 1104). An operator or head designer may define one or more time thresholds for a printhead. For example, an operator may test a printhead at different temperatures to determine the response time of a piezoelectric actuator, and define one or more time thresholds that relate to temperature. The time thresholds may define one or more temperature ranges or temperature indicators. For instance, assume that a time threshold ($T_{THRESH}$) is determined for a piezoelectric actuator 310 at a threshold temperature (e.g., 50° C.). As described above, a lower temperature relates to a lower capacitance of a piezoelectric actuator 310, which relates to a smaller RC constant, which relates to a faster response time. A higher temperature relates to a higher capacitance of a piezoelectric actuator 310, which relates to a larger RC constant, which relates to a slower response time. When the response time of a piezoelectric actuator 310 is faster than the time threshold ($T_{THRESH}$), this is indicative of a temperature lower than the temperature threshold. When the response time of a piezoelectric actuator 310 is slower than the time threshold ($T_{THRESH}$), this is indicative of a temperature higher than the temperature threshold. Therefore, the response time may be mapped to temperature ranges or temperature indicators by defining one or more time thresholds ($T_{THRESH}$). Temperature detector 424 maps the response time to a first temperature range or a first temperature indicator when the response time is faster than the time threshold (step 1106). Temperature detector 424 maps the response time to a second temperature range or a second temperature indicator when the response time is slower than the time threshold (step 1108). For example, the first temperature range may be between 20° C. and 50° C., and the second temperature range may be between 50° C. and 80° C. (i.e., the first temperature range is lower than the second temperature range). When the temperature measurement is a temperature indicator, the first temperature indicator may be "low" or the like, and the second temperature indicator may be "high" or the like. Although one time threshold is discussed above, multiple time thresholds may be defined for multiple temperature ranges (e.g., 20° C.–40° C., 40° C.–60° C., 60° C.–80° C.) or multiple temperature indicators (e.g., low, medium, high).

Figure 13:
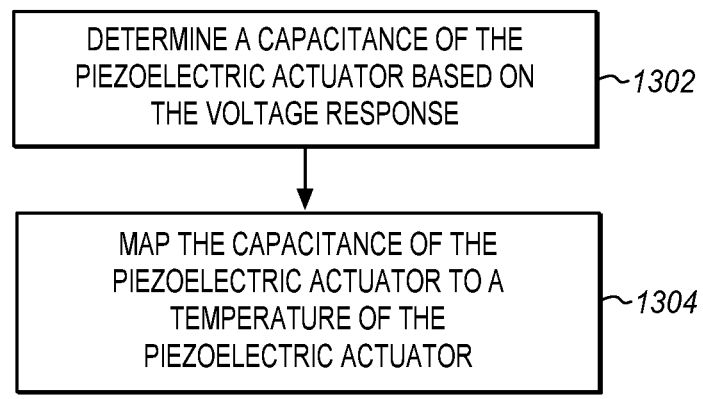
FIG. 13 is a flow chart illustrating a method of determining a temperature of a piezoelectric actuator in an illustrative embodiment.

In another embodiment, temperature detector 424 may determine an actual temperature of a piezoelectric actuator 310 (within a tolerance). FIG. 13 is a flow chart illustrating a method 1300 of determining a temperature of a piezoelectric actuator 310 in an illustrative embodiment. Temperature detector 424 determines or calculates a capacitance of the piezoelectric actuator 310 based on the voltage response 1000 (step 1302). To solve for the capacitance of the piezoelectric actuator 310, temperature detector 424 may solve for "C" in the equation discussed above at one or more times during the voltage response 1000. Alternatively, temperature detector 424 may determine a response time $T_R$ of the voltage response 1000 (see FIG. 12). Then, temperature detector 424 may solve for "C" in the following equation:

$$T_R = C \times R \times \left\{ \log\left(1 - \frac{V_{TH1} - V_{OUTLOW}}{V_{OUTHIGH} - V_{OUTLOW}}\right) - \log\left(1 - \frac{V_{TH2} - V_{OUTLOW}}{V_{OUTHIGH} - V_{OUTLOW}}\right) \right\}$$

Temperature detector 424 then maps the capacitance of the piezoelectric actuator 310 to a temperature of the piezoelectric actuator 310 (step 1304). For example, temperature detector 424 may access graph 600 (see FIG. 6) or a similar graph or lookup table that maps capacitance to temperature, and determine a temperature of the piezoelectric actuator 310 based on the determined capacitance.

Temperature controller 418 may selectively perform temperature measurements as described above on different piezoelectric actuators 310 in printhead 104. For instance, temperature controller 418 may selectively close the switching element 702 for a jetting channel 302 to perform a temperature measurement on the piezoelectric actuator 310 of that jetting channel 302. The temperature measurement of a piezoelectric actuator 310 is performed at a time when the jetting channel 302 is idle or non-jetting. Thus, temperature controller 418 may identify one or more idle jetting channels, and perform a temperature measurement on the idle jetting channels. Temperature controller 418 may perform temperature measurements on piezoelectric actuators 310 in different regions of printhead 104 in order to obtain a temperature distribution across printhead 104. If temperature controller 418 identifies a region within printhead 104 that is below a temperature threshold, then it may perform operations to heat the printhead locally, as described below.

Figure 14:
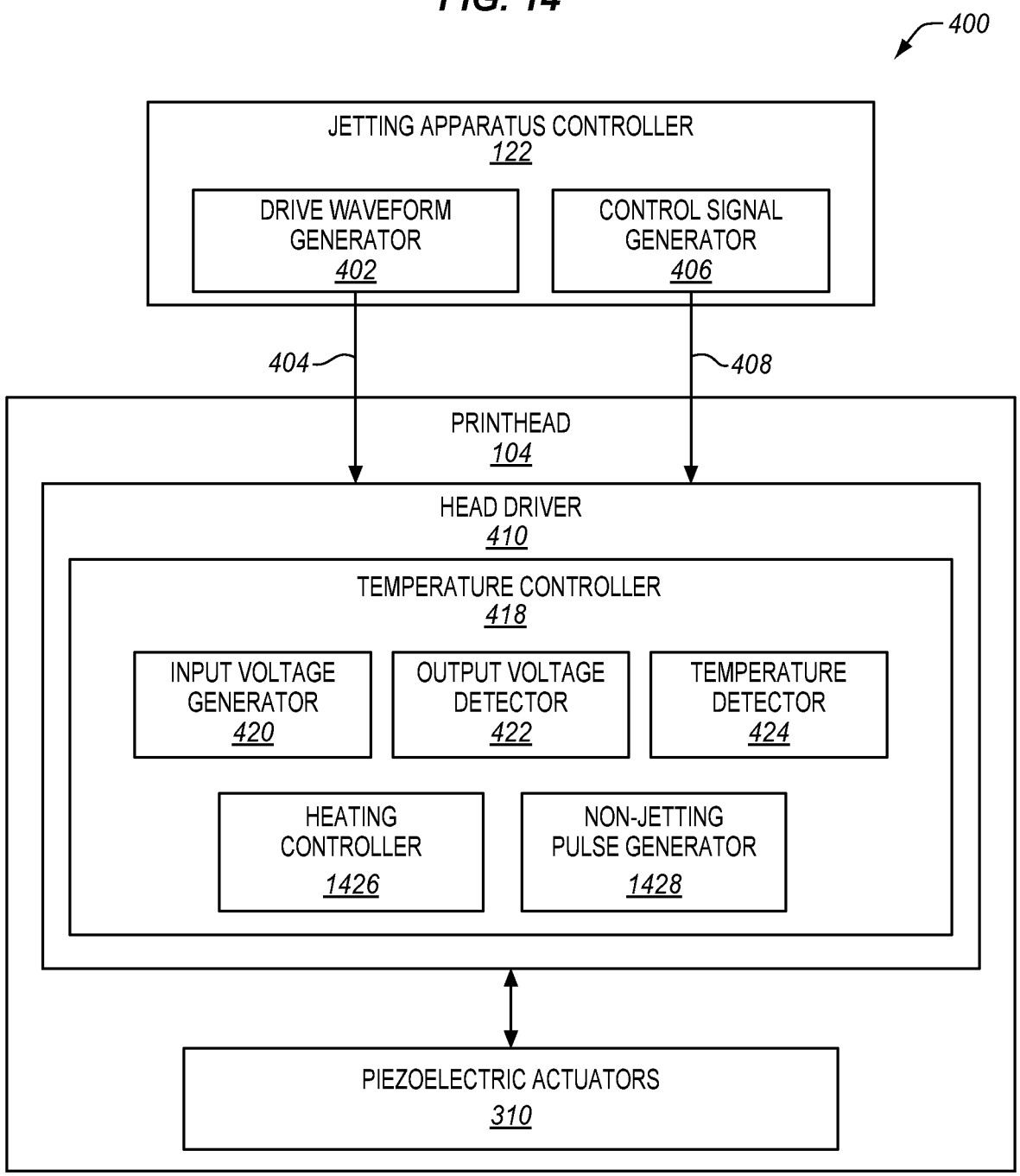
FIG. 14 is a schematic diagram of a drive circuit in another illustrative embodiment.

In one embodiment, temperature controller 418 may control piezoelectric actuators 310 to convert electrical energy into heat. If a region of printhead 104 is "cool", then specialized waveforms are provided to piezoelectric actuators 310 in that region to generate heat without causing those piezoelectric actuators 310 to jet. FIG. 14 is a schematic diagram of drive circuit 400 in another illustrative embodiment. In addition to determining the temperature of piezoelectric actuators, temperature controller 418 is configured to adjust, modify, or change the temperature across printhead 104. To do so, temperature controller 418 may further include a heating controller 1426 and a non-jetting pulse generator 1428. Heating controller 1426 comprises a circuit, firmware, or component that identifies regions in a printhead having temperature measurements below a temperature threshold. Non-jetting pulse generator 1428 comprises a circuit, firmware, or component that generates heating waveforms that include one or more non-jetting pulses, and applies the non-jetting pulse(s) to piezoelectric actuators 310 under control of heating controller 1426. A "non-jetting pulse" is defined as a pulse that causes a piezoelectric actuator 310 of a jetting channel 302 to actuate or fire, but does not cause a droplet to be jetted from the jetting channel 302. For example, the pulse width of a non-jetting pulse may be longer than a jetting pulse so that a droplet is not jetted from the jetting channel 302. In a printhead with a resonant frequency of about 83 kHz, the pulse width of a standard jetting pulse may be about 6 microseconds. At a pulse width of 6 microseconds, the pressure waves in a jetting channel 302 combine and peak at the nozzle 314 to jet a droplet from the nozzle 314. If the non-jetting pulse has a pulse width between about 12-14 microseconds in an 83 kHz head, then the pressure waves can destructively interfere with one another in the jetting channel 302 so that the combined pressure wave is not large enough to jet a droplet from the jetting channel 302. Non-jetting pulse generator 1428 may be part of drive waveform generator 402, which may be programmable to generate jetting pulses and non-jetting pulses.

Figure 15:
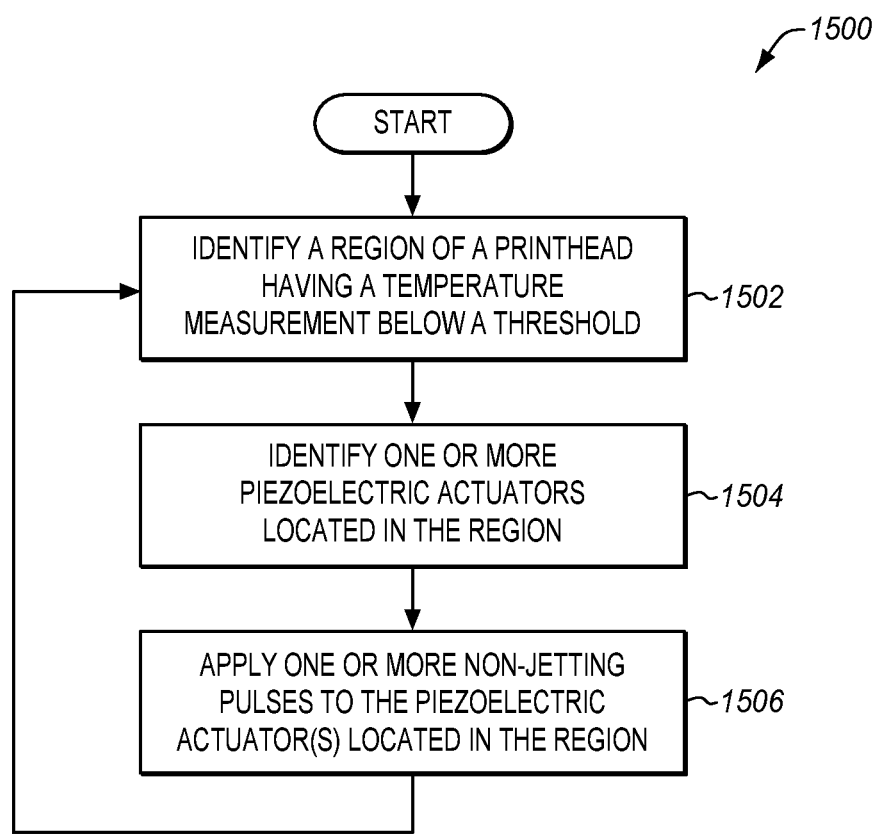
FIG. 15 is a flow chart illustrating a method of heating a printhead in an illustrative embodiment.

FIG. 15 is a flow chart illustrating a method 1500 of heating printhead 104 in an illustrative embodiment. There may be uneven jetting patterns in printhead 104 during printing operations, which causes some of the jetting channels 302 to be dormant for a time period. Thus, some regions of printhead 104 may be cooler than others causing an uneven temperature distribution across printhead 104. Additionally, environmental conditions within a printer may cause an uneven temperature distribution across printhead 104. Heating controller 1426 identifies a region of printhead 104 having one or more temperature measurements below a temperature threshold (step 1502). For example, heating controller 1426 may receive temperature measurements from temperature detector 424 for one or more piezoelectric actuators 310 in printhead 104, and identify a region that is "cool" based on the temperature measurements. Heating controller 1426 identifies one or more piezoelectric actuators 310 located in the region (step 1504). Non-jetting pulse generator 1428 applies one or more non-jetting pulses to the piezoelectric actuator(s) 310 (step 1506) under the control of heating controller 1426. In response to the non-jetting pulses, the piezoelectric actuator(s) 310 convert the electric energy of the pulses to heat without jetting a droplet from their corresponding jetting channels 302. Therefore, piezoelectric actuators 310 are able to increase the temperature of printhead 104 without actually jetting.

Non-jetting pulse generator 1428 may adjust the amount of heat generated by piezoelectric actuators 310 so that a target heat is reached. For example, non-jetting pulse generator 1428 may increase the number of non-jetting pulses sent to piezoelectric actuators 310 to increase the heat generated by piezoelectric actuators 310, or may decrease the number of non-jetting pulses sent to piezoelectric actuators 310 to decrease the heat generated by piezoelectric actuators 310. Non jetting pulse generator 1428 may additionally or alternatively increase the amplitude of the non-jetting pulses to increase the heat generated by piezoelectric actuators 310, or may decrease the amplitude of the non-jetting pulses to decrease the heat generated by piezoelectric actuators 310. Non-jetting pulse generator 1428 is able to selectively provide the non-jetting pulses to piezoelectric actuators 310 in printhead 104 to change the temperature across printhead 104.

Any of the various components shown in the figures or described herein may be implemented as hardware, software, firmware, or some combination of these. For example, a component may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, a component may be implemented as instructions executable by a processor or a computer to perform the functions of the component. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope of the invention is not limited to those specific embodiments. The scope of the invention is defined by the following claims and any equivalents thereof

What is claimed is:

1. A drive circuit comprising:
an input voltage generator configured to apply a step voltage that transitions between a first input voltage and a second input voltage when applied to a piezoelectric actuator of a printhead; and
a temperature detector configured to determine a temperature measurement at a location of the piezoelectric actuator within the printhead based on a voltage response of the piezoelectric actuator in response to the step voltage once.

2. The drive circuit of claim 1 wherein:
the temperature detector is configured to determine a response time of the voltage response, to compare the response time to a time threshold, to map the response time to a first temperature range when the response time is faster than the time threshold, and to map the response time to a second temperature range when the response time is slower than the time threshold; and
the first temperature range is lower than the second temperature range.

3. The drive circuit of claim 1 wherein:
the temperature detector is configured to determine a response time of the voltage response, to compare the response time to a time threshold, to map the response time to a first temperature indicator when the response time is faster than the time threshold, and to map the response time to a second temperature indicator when the response time is slower than the time threshold.

4. The drive circuit of claim 1 wherein:
the temperature detector is configured to determine a capacitance of the piezoelectric actuator based on the voltage response, and to map the capacitance of the piezoelectric actuator to a temperature of the piezoelectric actuator, wherein the temperature of the piezoelectric actuator is indicative of a temperature at the location of the piezoelectric actuator within the printhead.

5. The drive circuit of claim 1 wherein the printhead comprises a plurality of piezoelectric actuators, and the drive circuit further comprises:
a heating controller configured to identify a region of the printhead having one or more temperature measurements below a temperature threshold, and to identify at least one of the piezoelectric actuators located in the region; and
a non-jetting pulse generator configured to apply at least one non-jetting pulse to the at least one of the piezoelectric actuators located in the region to generate heat, wherein the at least one non-jetting pulse has a pulse width that is longer than a jetting pulse used to jet.

6. The drive circuit of claim 5 wherein:
the non-jetting pulse generator is configured to increase a number of non-jetting pulses applied to the at least one of the piezoelectric actuators to increase the heat generated by the at least one of the piezoelectric actuators in the region, and to decrease the number of the non-jetting pulses applied to the at least one of the piezoelectric actuators to decrease the heat generated by the at least one of the piezoelectric actuators in the region.

7. The drive circuit of claim 5 wherein:
the non-jetting pulse generator is configured to increase an amplitude of the at least one non-jetting pulse to increase the heat generated by the at least one of the piezoelectric actuators in the region, and to decrease the amplitude of the at least one non-jetting pulse to decrease the heat generated by the at least one of the piezoelectric actuators in the region.

8. A jetting apparatus comprising:
the drive circuit of claim 1; and
a media transport mechanism configured to move a medium relative to the printhead.

9. A method of operating a printhead, the method comprising:
applying a step voltage to a piezoelectric actuator of the printhead, wherein the step voltage transitions between a first input voltage and a second input voltage; and
determining a temperature measurement at a location of the piezoelectric actuator within the printhead based on a voltage response of the piezoelectric actuator in response to the step voltage once.

10. The method of claim 9 wherein determining the temperature measurement comprises:
determining a response time of the voltage response;
comparing the response time to a time threshold;
mapping the response time to a first temperature range when the response time is faster than the time threshold; and
mapping the response time to a second temperature range when the response time is slower than the time threshold;
wherein the first temperature range is lower than the second temperature range.

11. The method of claim 9 wherein determining the temperature measurement comprises:
determining a response time of the voltage response;
comparing the response time to a time threshold;
mapping the response time to a first temperature indicator when the response time is faster than the time threshold; and
mapping the response time to a second temperature indicator when the response time is slower than the time threshold.

12. The method of claim 9 wherein determining the temperature measurement comprises:
determining a capacitance of the piezoelectric actuator based on the voltage response; and
mapping the capacitance of the piezoelectric actuator to a temperature of the piezoelectric actuator;
wherein the temperature of the piezoelectric actuator is indicative of a temperature at the location of the piezoelectric actuator within the printhead.

13. The method of claim 9 wherein the printhead comprises a plurality of piezoelectric actuators, and the method further comprises:
identifying a region of the printhead having one or more temperature measurements below a temperature threshold;
identifying at least one of the piezoelectric actuators located in the region; and
applying at least one non-jetting pulse to the at least one of the piezoelectric actuators located in the region to generate heat, wherein the at least one non-jetting pulse has a pulse width that is longer than a jetting pulse used to jet.

14. The method of claim 13 wherein applying at least one non-jetting pulse to the at least one of the piezoelectric actuators comprises:
increasing a number of non-jetting pulses applied to the at least one of the piezoelectric actuators to increase the heat generated by the at least one of the piezoelectric actuators in the region; and
decreasing the number of the non-jetting pulses applied to the at least one of the piezoelectric actuators to decrease the heat generated by the at least one of the piezoelectric actuators in the region.

15. The method of claim 13 wherein applying at least one non-jetting pulse to the at least one of the piezoelectric actuators comprises:
increasing an amplitude of the at least one non-jetting pulse to increase the heat generated by the at least one of the piezoelectric actuators in the region; and
decreasing the amplitude of the at least one non-jetting pulse to decrease the heat generated by the at least one of the piezoelectric actuators in the region.

16. A printhead comprising:
at least one row of jetting channels configured to jet droplets of a print fluid, wherein each of the jetting channels comprises a piezoelectric actuator, a pressure chamber, and a nozzle; and a head driver configured to apply a step voltage to the piezoelectric actuator that transitions between a first input voltage and a second input voltage;

the head driver further configured to determine a temperature measurement at a location of the piezoelectric actuator within the printhead based on a voltage response of the piezoelectric actuator in response to the step voltage once.

17. The printhead of claim 16 wherein:

the head driver is configured to determine a response time of the voltage response, to compare the response time to a time threshold, to map the response time to a first temperature range when the response time is faster than the time threshold, and to map the response time to a second temperature range when the response time is slower than the time threshold; and the first temperature range is lower than the second temperature range.

18. The printhead of claim 16 wherein:

the head driver is configured to determine a response time of the voltage response, to compare the response time to a time threshold, to map the response time to a first temperature indicator when the response time is faster than the time threshold, and to map the response time to a second temperature indicator when the response time is slower than the time threshold.

19. The printhead of claim 16 wherein:

the head driver is configured to determine a capacitance of the piezoelectric actuator based on the voltage response, and to map the capacitance of the piezoelectric actuator to a temperature of the piezoelectric actuator, wherein the temperature of the piezoelectric actuator is indicative of a temperature at the location of the piezoelectric actuator within the printhead.

20. A jetting apparatus comprising:

the printhead of claim 16; and a media transport mechanism configured to move a medium relative to the printhead.

* * * * *